United States Patent [19]
Nillesen

[11] Patent Number: 4,809,207
[45] Date of Patent: Feb. 28, 1989

[54] RECURSIVE FIRST ORDER DIGITAL VIDEO SIGNAL FILTER

[75] Inventor: Antonius H. H. J. Nillesen, Eindhoven, Netherlands

[73] Assignee: U.S. Philips Corporation, New York, N.Y.

[21] Appl. No.: 829,574

[22] Filed: Feb. 14, 1986

[30] Foreign Application Priority Data

Mar. 20, 1985 [NL] Netherlands ............... 8500805

[51] Int. Cl.⁴ ............................... G06F 15/31
[52] U.S. Cl. ................. 364/724.03; 364/724.17; 364/745
[58] Field of Search ............... 364/724, 737, 745, 747

[56] References Cited

U.S. PATENT DOCUMENTS 4,034,196  7/1977  Butterweck et al. ............ 364/745
4,195,350  3/1980  Moore ........................... 364/745
4,236,224 11/1980  Chang ........................... 364/724
4,589,084  5/1986  Fling et al. ................... 364/745

OTHER PUBLICATIONS

Gold et al., Digital Processing of Signals, pp. 112-116, McGraw-Hill Book Co., New York, N.Y., 1971.

Primary Examiner—Gary V. Harkcom
Assistant Examiner—Dale M. Shaw
Attorney, Agent, or Firm—Edward W. Goodman

[57] ABSTRACT

Continued circulation of residual signal values in a recursive first order digital video signal filter, in which a truncation circuit (37) is used for eliminating a portion of the least significant bits in the feedback signal path (31, 37, 43, 11) of the filter, is prevented by adding (19, 47, 51) before the trucation circuit a logic one value to the feedback signal path at the level of the least significant bit of the bits remaining after the truncation circuit. Video signal filters of such a type are frequently used as noise suppression circuits.

2 Claims, 1 Drawing Sheet

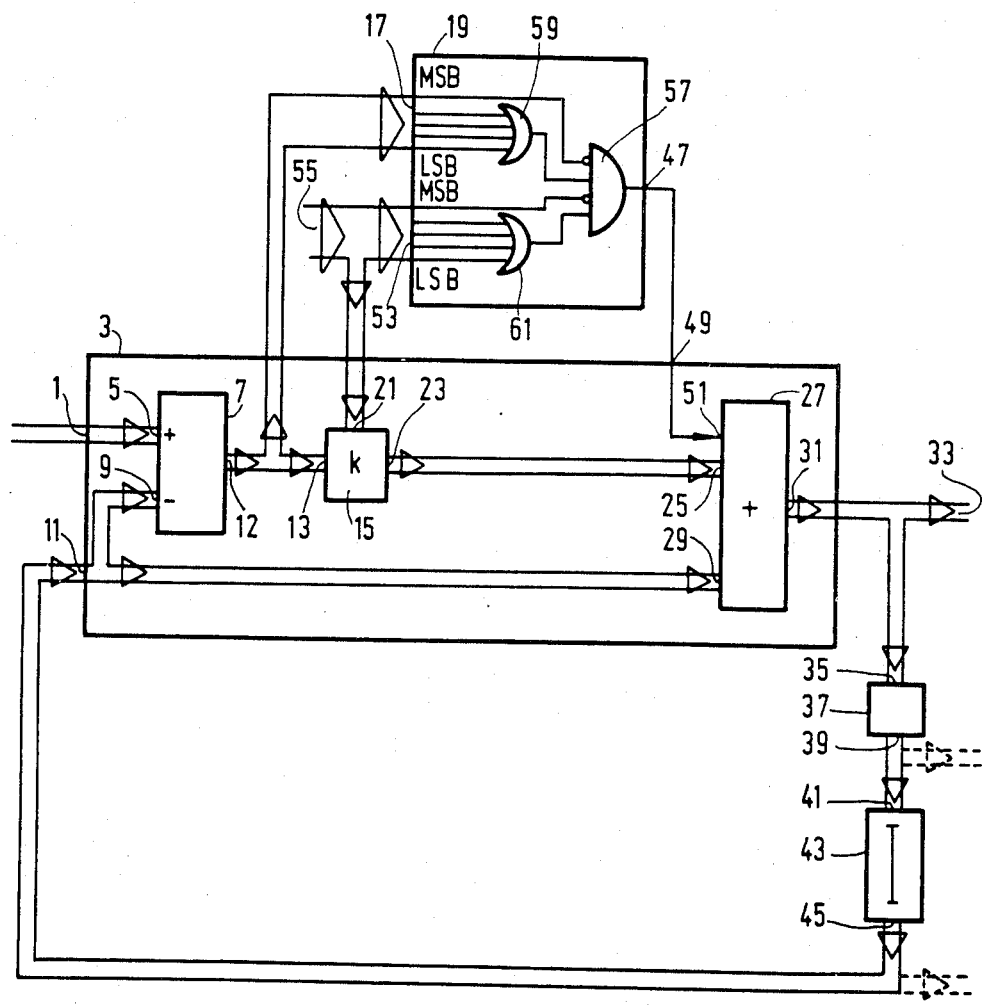

RECURSIVE FIRST ORDER DIGITAL VIDEO SIGNAL FILTER

BACKGROUND OF THE INVENTION

The invention relates to a recursive first order digital video signal filter comprising a combining circuit having a first input coupled to an input for a digital video signal of the filter, an output coupled via a signal path including a delay circuit to a second input of the combining circuit and a variable transfer circuit for controlling the ratio between the transferred portions of the signals applied to the first and second inputs, which transferred portions are contained in a signal at the output, the signal path comprising the delay circuit including a truncation circuit for reducing the number of bits conveyed through the signal path by cancelling a least significant portion of these bits.

BBC Report RD 1975/3 discloses a video signal filter of the above-defined type. Such a filter is often used as a noise suppression circuit. Because of the reduction by the truncation circuit of the number of bits fed back from the output to the second input of the combining circuit, the phenomenon occurs, at positive signal transients or negative pulses at the first input of the combining circuit that a residual value of the signal at the first input continues to circulate in the filter, which may result in annoying phenomena.

SUMMARY OF THE INVENTION

An object of the invention is to prevent this unwanted circulation of signal residues in the filter.

According to the invention, a recursive first order digital video signal filter of the type defined in the opening paragraph is characterized in that the combining circuit has a third input which is coupled to an output of a logic circuit coupled to the first and the second input of the combining circuit for at least, at the occurrence of values of the signal at the first input which exceed the values of the signal at the second input, adding to the signal at the output of the combining circuit the logic one value at the level of the least significant bit of the number of bits remaining at the output of the truncation circuit when in the transfer circuit the transfer of the signals at both the first and second inputs of the combining circuit is unequal to zero.

It was found that the measure according to the invention completely eliminates the circulation of residual values, and that consequently the annoying phenomena produced by this residual value circulation have disappeared.

BRIEF DESCRIPTION OF THE DRAWING

The invention will now be described in greater detail by way of example with reference to the accompanying drawing which shows only one FIGURE illustrating a block diagram of a digital video signal filter according to the invention.

DESCRIPTION OF THE PREFERRED EMBODIMENTS

In the FIGURE, a digital video signal to be filtered is applied to a first input 1 of a combining circuit 3, which input also constitutes the input of the video signal filter. Generally, this input 1 and also inputs and outputs described in the sequel will be of a multiple construction to receive or supply a plurality of bits of the video signal simultaneously. If so desired, serial processing of the bits may alternatively be used.

The input 1 of the combining circuit 3 is connected to a non-inverting input 5 of a subtracting circuit 7 an inverting input 9 of which is connected to a second input 11 of the combining circuit 3. An output 12 of the subtracting circuit 7 is connected to an input 13 of a transfer circuit 15 and to an input 17 of a logic circuit 19.

The transfer circuit 15 has a transfer factor k which varies in response to a setting signal applied to a setting signal input 21. At its output 23 a value, multiplied by a factor of k of the signal at the input 13, then becomes available. This signal is applied to an input 25 of an adder circuit 27, a further input 29 of which is connected to the second input 11 of the combining circuit 3.

An output 31 of the adder circuit 27, which at the same time constitutes the output of the combining circuit 3, supplies from an output 33 of the filter a filtered digital video signal and applies it to an input 35 of a truncation circuit 37. The truncation circuit 37 reduces the number of bits of the video signal in a singal path leading from the output 31 of the combining circuit 3 via the truncation circuit 37, an output 39 thereof, an input 41 of a delay circuit 43 and an output 45 thereof to the second input 11 of the combining circuit 3, by removing one or a plurality of the least significant bits.

Disregarding the logic circuit 19, the circuit described so far constitutes a recursive first order digital video signal filter as disclosed in the above-mentioned BBC Report RD 1975/3. Page 8 of this Report describes that errors are produced in such a filter on removal of the least significant bits. These errors are prevented in the present invention by applying from an output 47 of the logic circuit 19 a bit at the level of the least significant bit at the output 39 of the truncation circuit 37 to a third input 49 of the combining circuit 3, which is connected to an input 51 of the adder circuit 27.

To this end, the logic circuit 19 has a further input 53 which, as is also the input 21 of the transfer circuit 15, is connected to an input 55 to which a digital signal combination is applied which determines the value of the transfer factor k of the transfer circuit 15.

The logic circuit 19 comprises an AND-gate 57 an inverting input of which receives the most significant bit from the input 17. This most significant bit indicates the sign of the difference formed by the subtracting circuit 7 when the latter supplies an output signal combination in the two's complement mode, as is assumed here.

A second input of the AND-gate 57 is connected to an output of an OR-gate 59 to which all less significant bits from the input 17 of the logic circuit are applied. A third of the AND-gate is an inverting input which receives the most significant bit from the input 53 and a fourth input is connected to an output of an OR-gate 61 which receives all the less significant bits of the transfer factor k from the input 53 of the logic circuit 19.

When a positive step occurs in the signal at the input 1 of the circuit, the most significant bit at the input 17 assumes a zero value and from the less significant bits at least one will assume the logic 1-value. Assuming the transfer factor k to be equal to the value applied to the input 53 of the logic circuit 19, and assuming this value to be less than one and greater than zero, the most significant bit at this input is zero and at least one of the less significant bits has the logic value 1. All of the inputs of the AND-gate 57 then have the logic one value and the logic circuit 19 applies a logic one signal to the third input 49 of the combining circuit 3, as a result of which, after a short circulation time of the filter, it was found that no residual value occurs any more at the output 33 of the circuit.

At negative values of the difference at the output 12 of the subtracting circuit 7 and when the difference is zero, at least one of the inputs of the AND-gate 57 coupled to the input 17 of the logic circuit 19 remains zero and also the output 47 has a zero value. This is also the case for the inputs of the AND-gate which are coupled to the inputs 53 of the logic circuit 19 when the transfer factor k becomes equal to zero or to one, which corersponds to an unaffected circulation of the value present in the filter or stopping the filtering action, respectively. Also then the output 53 of the logic circuit 19 remains zero.

If these zero or one-values of the transfer factor k are not allowed in the signal at the input 55 of the circuit, then the inputs of the AND-gate 57, coupled to the input 53 of the logic circuit 19, may of course be omitted.

The combining circuit 3 may be of a different structure, thus the signal at the first input 1 of the circuit may, for example, first be multiplied by k and the signal at the second input 11 by (1−k) and the input signals thus multiplied can be applied to the adder circuit 27. The subtracting circuit 7 must then be incorporated in the logic circuit 19.

Additionally, it is, for example, possible to interchange the inputs of the subtracting circuit 7 when the input 25 of the adder circuit 27 is an inverting input or when a sign inversion is effected in the signal path from the output 12 of the subtracting circuit 7 to the input 25 of the adder circuit 27. It is, for example, possible to design alternative constructions of the combining circuit 3 in which the signal from the first input 1 is applied to both the subtracting circuit and the adder circuit 27 and the signal from the second input 11 is applied only to the subtracting circuit 7, when an appropriate sign is chosen for signal processing in the signal path from the output 12 of the subtracting circuit 7 to the input 25 of the adder circuit 27.

In a circuit in which the signal at the input 17 of the logic circuit 19 originates from a subtracting circuit 7, whose input 5 is an inverting input and the input 9 a non-inverting input, the OR-gate 59 can be omitted in the logic circuit 19 as then the sign bit only supplies the same information as is given in the case shown in the drawing by the combination of the sign bit and the less significant bits. The sign bit can then be applied without inversion to the relevant input of the AND-gate 57. If then also the zero and one-values of k cannot be present, the function of the logic circuit 19 can be simplified such that it only has a through-connection function.

The output 33 of the circuit may optionally be connected to the output 39 of the truncation circuit 37 or to the output 45 of the delay circuit 43, the truncation circuit may then form part of the output circuit of the adder circuit 27.

In the circuit described a signal having a logic value zero is also produced at the output 47 of the logic circuit 19 when the signals at the first input 1 and at the second input 11 of the combining circuit 3 have the same values; the OR-gate 59 then namely supplies a zero-value output signal. Omitting this OR-gate 59 might provide a simplification of the logic circuit 19, but then, after each circulation a transient occurs in the signal at the output 47 of the logic circuit 19, causing the value of the signal at the input 41 of the delay circuit 43 to deviate by alternately zero and one from the value of the signal at the input 1 of the combining circuit 3. A possibly occurring overflow then may be prevented by using a limiter circuit before the truncation circuit 37.

If so desired, the input 55 of the video signal filter may be coupled to the output 12 of the subtracting circuit 7, it then being possible to obtain a switched-off and/or circulation state of the filter by means of an additional signal combination to be applied.

What is claimed is:

1. A recursive first order digital video signal filter comprising: a combining circuit (3) having a first input (1) coupled to an input for a digital video signal of the filter, a variable transfer circuit and an output (31), means coupling said output via a signal path including a delay circuit (43) and a truncation circuit to a second input (11) of the combining circuit, second means coupling an input of the variable transfer circuit to at least one input of the combining circuit, third means coupling an output of the variable transfer circuit to said output of the combining circuit said variable transfer circuit being operative to control the ratio between transferred portions of signals applied to the first (1) and second (11) inputs, which transferred portions are contained in a signal at the output (31), the truncation circuit being arranged to reduce the number of bits conveyed through the signal path by cancelling a least significant portion of these bits, characterized in that the combining circuit (3) has a third input coupled to an output (47) of a logic circuit (19) coupled to the first (1) and the second (11) input of the combining circuit, said logic circuit, at the occurrent of values of the signal at the second input (11) which do not exceed values of the signal at the first input, adding to the signal at the output (31) of the combining circuit (3) a logic one value at the level of the least significant bit of the bits remaining at the output (39) of the truncation circuit (37) when in the transfer circuit (15) the transfer of the signal at both the first (1) and the second (11) inputs of the combining circuit (3) is unequal to zero, and otherwise the logic zero value.

2. A recursive first order digital video signal filter as claimed in claim 1, further comprising means for comparing signals from the first and second inputs of the combining circuit to produce a logic zero value at the output (47) of the logic circuit when said signals have the same values.

* * * * *